United States Patent
Keiflin et al.

(10) Patent No.: US 10,567,802 B2
(45) Date of Patent: Feb. 18, 2020

(54) METHOD FOR OPTIMISING THE TRANSMISSION OF VIDEO DATA STREAMS IN A WIRELESS NETWORK

(71) Applicant: VOGO, Montpellier (FR)

(72) Inventors: Pierre Keiflin, Carnon (FR); Christophe Carniel, Castelnau le Lez (FR); Daniel Dedisse, Prades le Lez (FR)

(73) Assignee: VOGO, Montpellier (FR)

( * ) Notice: Subject to any disclaimer, the term of this patent is extended or adjusted under 35 U.S.C. 154(b) by 0 days.

(21) Appl. No.: 15/760,435

(22) PCT Filed: Sep. 15, 2016

(86) PCT No.: PCT/FR2016/052331
§ 371 (c)(1),
(2) Date: Mar. 15, 2018

(87) PCT Pub. No.: WO2017/046528
PCT Pub. Date: Mar. 23, 2017

(65) Prior Publication Data
US 2018/0262778 A1    Sep. 13, 2018

(30) Foreign Application Priority Data
Sep. 16, 2015 (FR) .................................. 1558670

(51) Int. Cl.
*H03M 13/00* (2006.01)
*H04N 19/65* (2014.01)
(Continued)

(52) U.S. Cl.
CPC ............ *H04N 19/65* (2014.11); *H03M 13/37* (2013.01); *H03M 13/373* (2013.01);
(Continued)

(58) Field of Classification Search
CPC .... H04N 19/65; H04N 19/895; H04N 19/176; H04N 19/166; H04N 19/188;
(Continued)

(56) References Cited

U.S. PATENT DOCUMENTS

| 7,224,702 B2* | 5/2007 | Lee | ........................ H04L 1/1809 |
| | | | 370/473 |
| 2002/0114283 A1 | 8/2002 | Lee | |
| 2007/0153898 A1* | 7/2007 | Yim | ...................... H04N 19/895 |
| | | | 375/240.16 |

FOREIGN PATENT DOCUMENTS

| KR | 100860770 B1 | 9/2008 |
| WO | WO-2008/006014 A2 | 1/2008 |
| WO | WO-2012/054570 A1 | 4/2012 |

OTHER PUBLICATIONS

International Search Report issued in International Patent Application No. PCT/FR2016/052331, dated Nov. 21, 2016.
(Continued)

*Primary Examiner* — Samir W Rizk
(74) *Attorney, Agent, or Firm* — Arent Fox LLP

(57) ABSTRACT

The invention relates to a method for improving the reliability and the reception quality of video data streams over a wireless network controlled by Wi-Fi communication protocols, the video data stream being encoded in the form of packets Q each including K first data blocks and H redundancy blocks for forward error correction (FEC), said stream comprising a series of packets G each including K+N blocks which are transmitted by at least one transmitting device multicasting same to client viewing devices such as smartphones. Said method includes the following steps, implemented by the client device for each of the data packets G received from the one or more transmitting devices: a/ monitoring the correct reception of the K first data blocks, decoding and viewing the video stream if the result is
(Continued)

Figure 1:
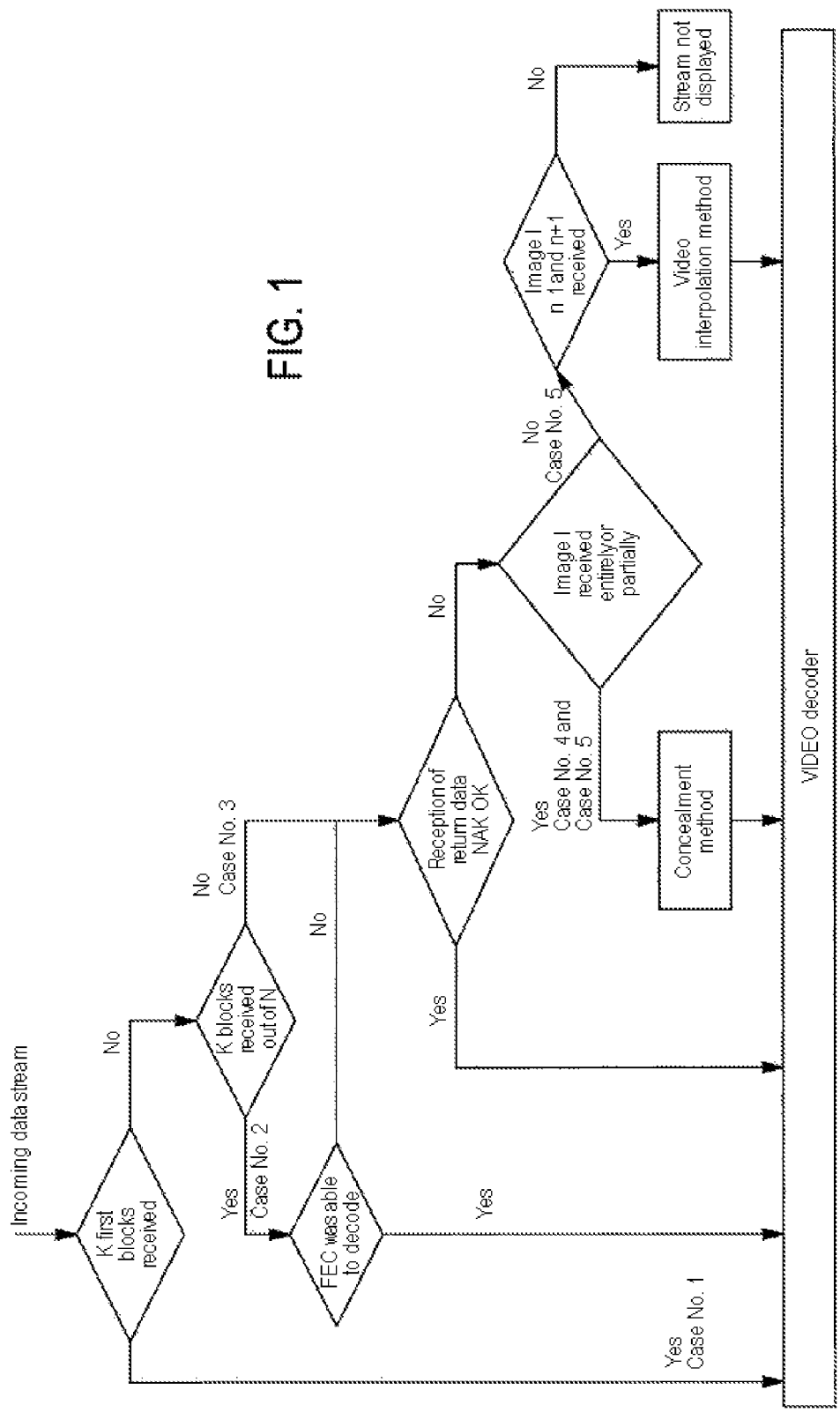

positive; b/ if all of the K first data blocks are not received, decoding if possible by means of a forward error correction (FEC) algorithm; c/ if the total number X of K+N blocks received is lower than K or if a positive result is not obtained from the preceding decoding step, sending a message regarding the one or more lost blocks; d/ if a statistical algorithm of the transmitting device organizes the resending of the missing data, checking the reception of data according to a/ and b/, decoding and viewing the video stream if the result is positive.

14 Claims, 2 Drawing Sheets

(51) Int. Cl.
| | |
|---|---|
| H04N 21/438 | (2011.01) |
| H04N 19/895 | (2014.01) |
| H04N 19/169 | (2014.01) |
| H04N 21/6408 | (2011.01) |
| H04N 19/176 | (2014.01) |
| H04N 21/6405 | (2011.01) |
| H03M 13/37 | (2006.01) |
| H04N 21/6375 | (2011.01) |
| H04N 19/166 | (2014.01) |
| H04L 1/18 | (2006.01) |

(52) U.S. Cl.
CPC ... *H03M 13/6306* (2013.01); *H03M 13/6527* (2013.01); *H04N 19/166* (2014.11); *H04N 19/176* (2014.11); *H04N 19/188* (2014.11); *H04N 19/895* (2014.11); *H04N 21/4382* (2013.01); *H04N 21/6375* (2013.01); *H04N 21/6405* (2013.01); *H04N 21/6408* (2013.01); *H04L 1/1812* (2013.01)

(58) Field of Classification Search
CPC ........... H04N 21/4382; H04N 21/6375; H04N 21/6405; H04N 21/6408; H03M 13/373; H03M 13/6306; H03M 13/6527; H03M 13/37
See application file for complete search history.

(56) References Cited

OTHER PUBLICATIONS

Kumwilaisak et al., "Spatial error concealment with sequence-aligned texture modeling and adaptive directional recovery," J. Vis. Commun. Image R., vol. 22, 2011, pp. 164-177.

Li et al., "Forward and Retransmitted Systematic Lossy Error Protection from IPTV Video Multicast," Department of Electrical Engineering, Stanford University, Packet Video Workshop, 2009, pp. 1-9.

* cited by examiner

METHOD FOR OPTIMISING THE TRANSMISSION OF VIDEO DATA STREAMS IN A WIRELESS NETWORK

CROSS REFERENCE TO RELATED APPLICATIONS

This application is a 35 U.S.C. 371 National Phase of PCT Application No. PCT/FR2016/052331 filed Sep. 15, 2016, which claims benefit to FR Application No. 1558670 filed Sep. 16, 2015, the disclosure of which is hereby incorporated by reference in its entirety.

The present invention deals with a method for enhancing the reliability and the quality of reception of video data streams over a wireless digital network among others, governed by communication protocols for example of Wi-Fi type. The streams concerned are multicasted, or multibroadcast, that is to say that they originate from at least one transmitter broadcasting them to receivers of a group subscribed to said broadcast. The receiving devices, or clients, forming the recipient group are capable of viewing the streams sent, and are provided for this purpose with at least one application making it possible to process and view the information received.

More particularly, the present invention relates to a processing, performed on reception of video streams, that makes it possible to enhance the quality of the decoded signals when there are blocks of data lost.

One of the possible applications of the invention is the almost real time broadcasting of events of sports meeting or show type, within the perimeter of the enclosure where said event takes place. The client application software on the one hand allows the fluid viewing of video images offered among other things by a service provider linked to the organizer of the event, and, on the other hand, the viewing to be enriched by processing operations likely to confer an added value on the video streams received, for example a repetition and therefore a reviewing of certain sequences, if necessary in slow motion.

Such processing operations require the video streams, conventionally transmitted in the form of packets of information essentially containing groups of images, to be received in a sufficient quantity first of all for the viewing thereof to be simply comfortable, then also for any subsequent signal processing operations to be able to be based on an information base sufficient for the performance thereof.

Now, on wireless local area networks, whatever the communication protocols used and the broadcasting mode—that therefore applies also to the multicast Wi-Fi networks which will be used in the text as preferential example—the transmission error rate lies between 0% and 15%, sometimes more. This error rate in practice consists of a loss of blocks of information transmitted by the network. If video stream transmissions are assumed, the result of these losses is poor quality of the videos obtained, the images being able to exhibit exogenous macroblocks which degrade them and consequently degrade the quality of the streams, when they are not purely and simply lost. Depending on the case, these losses can affect the video stream as far as preventing the broadcasting of certain sequences.

In practice, the video data streams are coded in the form of packets G which are in reality essentially composed of groups of images of different categories, these packets being then divided into data blocks. According to a conventional scheme, which results also from the advance implementation of lost data recovery conditions, these packets G each comprise K first data blocks which essentially code the images of the video stream and N so-called redundancy blocks that can be used if necessary for forward error correction (by an algorithm of FEC type).

A stream therefore comprises a succession of groups of images or packets G each comprising K+N blocks transmitted by the transmitting device, which multicasts it to client viewing devices, for example smartphones or tablets.

To ensure a reliable and quality reception of the video streams, despite the losses that are always possible, the method comprises, according to the invention and principally, the following steps, implemented by each client device for each of the data packets G received from the transmitting device or devices:

a/ checking the correct reception of the K first data blocks, decoding and viewing the video stream in case of a positive result;

b/ in the absence of reception of all of the K first data blocks, and if the total number X of K+N blocks received is at least equal to K, decoding, by means of a forward error correction (FEC) algorithm, to retrieve the missing data of the blocks K, decoding and viewing the video stream in case of positive result;

c/ if the total number X of blocks K+N received is less than K or, in the absence of a positive result to the decoding via the forward error correction algorithm (FEC), sending, by the client device, of a unicast message giving the transmitter information at least concerning the last block or blocks lost;

d/ if a statistical algorithm of the transmitting device organizes the returning of the missing data, checking the correct reception of the data returned by the transmitting device according to a/ and b/, decoding and viewing the video stream in case of a positive result.

The idea on which the invention is based is to try to correct the errors by successive steps, the implementation of each of the steps depending on at least one test performed in the preceding step. The implementation of the steps depends in particular on the rate and the distribution of the errors detected in the data packets. In a favorable hypothesis, only the first step, that is to say the first test, is implemented. If all of the K first blocks has arrived at the client device, that means that there is no error, no loss of information, and the video decoding can be performed for the viewing.

In a more unfavorable hypothesis, the FEC algorithm must be used to retrieve missing data: this step in fact makes it possible to correct the losses of blocks distributed in time, when the error rate is not too great (it is then qualified as low to medium). The condition for implementation of this step is that the total number of blocks received is at least equal to K.

Depending on the typology of the errors, this step can perfectly well be either a failure or unfeasible through lack of data, and therefore not make it possible to correct the errors: such is, for example, the case when errors occur, for example by entire packets, that is to say grouped errors, representing an error rate qualified as medium to high. Another routine is then to be implemented, according to the invention, which assumes an exchange with the transmitting device. The client which is in this case sends a unicast message to the transmitter, which possibly returns the missing data following a statistical algorithm. That obviously assumes that the latter have been identified by the client device.

The integrity or the legibility of the data returned is checked according to the steps a/ and b/ on reception by the client device, which can then proceed to decode the stream for it to be viewed.

The method of the invention however goes further, and also considers the hypothesis whereby the data returned by the transmitting device are not always received or are not received sufficiently rapidly, in conditions allowing the video stream to be displayed correctly.

In this case, the following steps are implemented according to the invention:

e/ in the absence of correct reception of the data returned, checking the reception of a reference image with internal coding in the packet G of data received, then f/ if such a reference image is received complete, implementing an error concealment algorithm applied to the compressed data, and g/ decoding and viewing the video stream.

The reference image alluded to is that with which the packet G typically begins, essentially formed by a group of images, the succession of which, repeated periodically until the end of the encoding, in short constitutes the encoded video stream. This is a reference image with internal coding whose decoding is autonomous and does not depend on the preceding or subsequent images. This category is used in association with images of other categories, for example with predictive coding, in an order which defines a particular group. The visible images are then generated (or decoded) from the coded images contained in this predefined group.

This type of image, independent of the other types of image forming the group, is considered as reference image, and the test aiming to determine the relevance of the implementation of an error concealment algorithm is therefore preferably, according to the invention, based on the complete existence of such a reference image.

When a client device has not been able to correctly reconstruct the video stream returned by the transmitting device, it implements an error concealment step. The latter is however performed only on the condition that a reference image has been received in the data packet G process. This new step based on the concealment makes it possible to conceal the errors and provide, at the time of decoding, encoded and computed samples which replace missing samples of the signal from data of the reference image and any other images received in the packet G. The estimation of the missing parts of the images on the encoded data makes it possible to visually attenuate the data reception errors in the compressed video streams, and is performed by using the spatial and temporal correlations between images, either within a same image (spatial correlation) or in past or future images (temporal correlation). The idea on which these routines are based is that there are rarely abrupt changes between spatially adjacent pixels of an image, and that there is a temporal continuity in the successive images of a video sequence.

The method of the invention then considers the possibility of the non-reception of such a reference image with internal coding in the data packet of the stream currently being processed. In this case, according to a possibility specific to the invention, the following steps are implemented:

h/ in case of non-reception of a reference image with internal coding in the data packet G received, checking the reception of at least one reference image of the preceding G−1 and next G+1 packets, i/ implementing an interpolation method on the uncompressed or linear data for the reconstruction of images, then j/ decoding and viewing the video stream.

This new step of the method of the invention this time uses algorithmic reconstruction possibilities rather than error concealment techniques used above, in a context that is a little different. It involves interpolation methods which are also considered temporally or spatially, and this time operate with uncompressed video streams. In a temporal interpolation, they make it possible to generate missing images in a stream by using the preceding and subsequent images.

If it so happens that none of the steps described previously allow a conclusion, particularly in the context of the last step implemented, because there is no reception of at least one reference image of the preceding G−1 and next G+1 packets, the packet G is not displayed.

The method of the invention is in reality a chain of successive solutions aiming to adapt the response of the system to video signal transmission defects, the nature and gravity of which are detected progressively.

Figure 2:
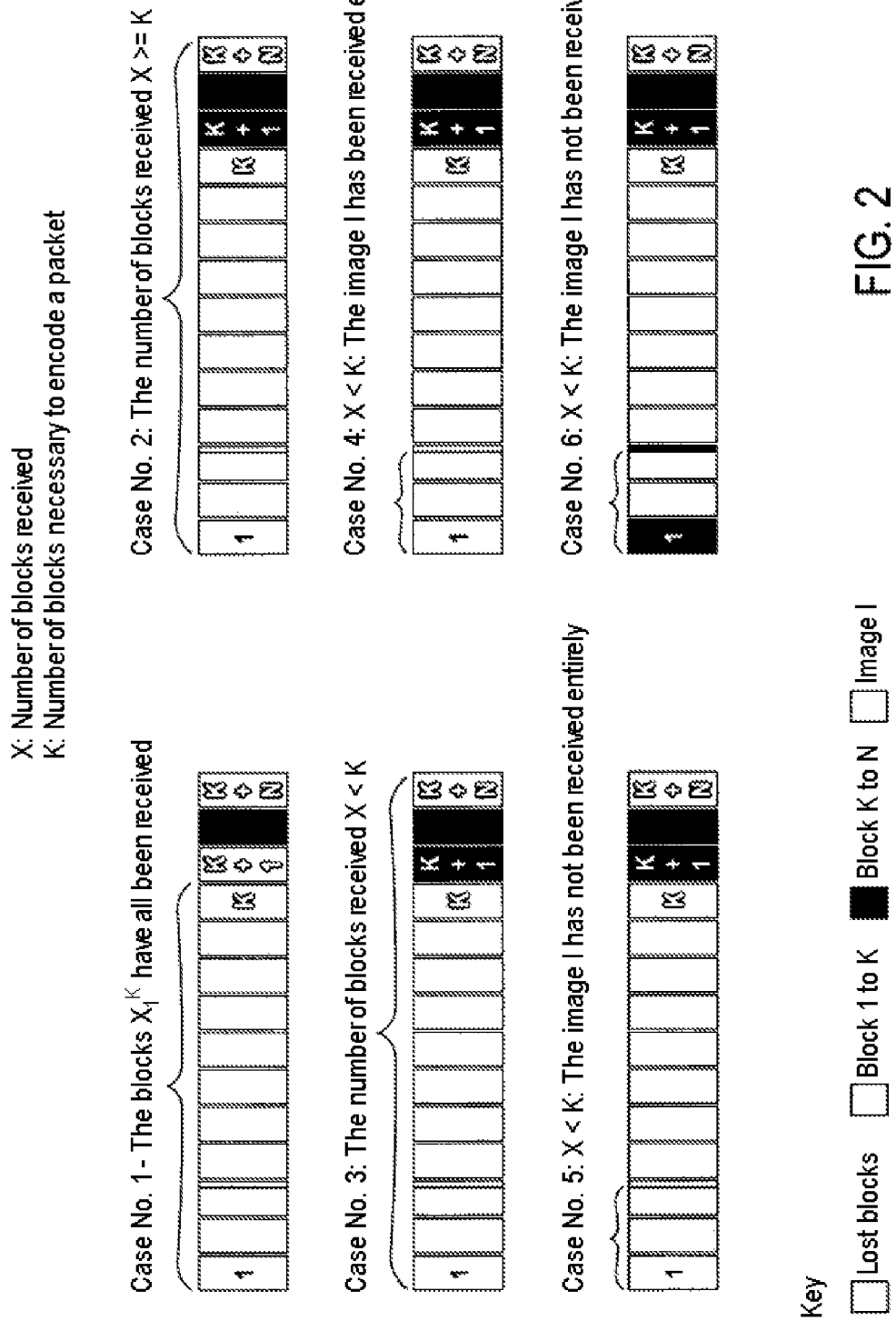

The invention will now be described in more detail, with reference to the attached figures, representing one possibility of implementation of the method of the invention, and for which:

FIG. 1 represents a flow diagram schematically representing the overall implementation of the method of the invention; and FIG. 2 shows a same data packet, constituting a possible encoding of a group of images and, by repetition, a video stream, different types of possible data losses being represented on these data packets.

Referring to FIG. 1, the first test performed in the context of the method consists in checking whether the K first blocks have been received. In each step, after each test, in a favorable hypothesis, that is to say if there is no data loss problem, or if any such problems have been resolved, the data packets forming the video stream are processed by the video decoder for the broadcasting of the transmitted stream.

If the result to the first test is positive, that means in particular that the packet data corresponds to the case No. 1 of FIG. 2, whereby the K first blocks of the data packet have been received. In FIG. 2, a visual code defines the different blocks, appearing in the key given at the bottom of the figure, and comprising the first K blocks, the blocks K to N, the reference images I and the lost blocks.

In a negative hypothesis, the next test relates to the number X of blocks received out of all of the blocks K+N transmitted, that is to say including the redundancy blocks N, placed after the blocks K in the representations of FIG. 2. If the total number of blocks received is at least equal to K (even in case of errors, lost blocks), that is to say if X≥K, corresponding to the case No. 2 of FIG. 2, a forward error correction (FEC) algorithm is implemented, then a new checking test is implemented. Since it involves a type of correction which is suited to losses distributed in time, over all of the data packet, that is to say over all of the blocks N+K, this error correction strategy does not necessarily work.

If this test is negative, which can mean that data losses are rather concentrated and not distributed, or if the number X of blocks received out of the N+K blocks is less than K—corresponding to the case No. 3 of FIG. 2—a procedure (called NAK) for recalling unreceived data is launched. This routine involves a unicast communication in the reverse direction, between one of the receiving client devices and a transmitting device, and necessitates an identification of the missing data.

The latter returns, by unicast or multicast, the data identified by the client as not received according to a statistical algorithm, and a new correct reception test is performed in the client device. The next test relates to the correct reception of a reference image I with internal coding for each packet or group of images i. In FIG. 2, the reference image I is placed at the start of the packet, which is very generally the place that it occupies in such encodings. If this image I is completely or partially received, that is to say in cases No. 4 and No. 5 illustrated in FIG. 2, the transmission errors observed and which have not been resolved in the preceding steps are processed by means of a concealment algorithm. The errors are in this case concealed at the video decoder level, but not corrected. The aim of this type of routine, which acts on the compressed data streams, is to visually attenuate the reception errors in the video streams.

In the reverse hypothesis, that is to say if there is no reception of a reference image with internal coding I in the group of images or packet G, the method of the invention tests the reception of such a reference image I in the packets or groups of images G−1 and G+1. That corresponds to the case No. 6 of FIG. 2. If this is the case, a reconstruction of the damaged images can still be implemented, on the basis of an interpolation algorithm acting on the uncompressed video streams, and generating the missing images or the parts of missing images respectively by using the immediately preceding or subsequent images in the succession of images, in a temporal perspective, or by using the parts of the same image immediately adjacent to those which are missing, in a spatial perspective.

When none of these successive processing operations succeeds satisfactorily, the packet or group of images is not displayed.

The invention is of course not limited to the examples described and explained with reference to the figures, but it encompasses the variants and versions which fall within the scope of the claims.

The invention claimed is:

1. A method for enhancing the reliability and the quality of reception of video data streams over a wireless network governed by WiFi-type communication protocols, the method comprising:
 receiving, by a client device, a video data stream coded in a plurality of data packets G each comprising K first data blocks and N redundancy blocks for forward error correction (FEC), said video data stream comprising a succession of packets G each comprising K+N blocks being transmitted by at least one transmitting device multicasting the video data stream to the client device;
 processing each of the data packets G received from the transmitting device, wherein processing each data packet comprises:
 responsive to determining a correct reception of the K first data blocks, decoding and viewing the video stream using the K first data blocks;
 responsive to determining an absence of reception of all of the K first data blocks, and that a total number of K+N blocks received is at least equal to K, decoding, using a forward error correction algorithm (FEC), to retrieve the missing data of the blocks K, and decoding and viewing the video stream in case of a positive result;
 responsive to determining that if the total number of K+N blocks received is less than K or in the absence of a positive result to the decoding via the forward error correction algorithm (FEC), sending, by the client device, of a unicast message giving the transmitting device information at least concerning the missing data of the blocks K; and
 if a statistical algorithm of the transmitting device organizes the returning of the missing data, checking the correct reception of the missing data returned by the transmitting device, decoding and viewing the video stream in case of a positive result;
 in the absence of correct reception of the missing data returned by the transmitting device or in the absence of returned data, checking the reception of a reference image with internal coding in the received data packet G, then if such a reference image is received complete:
 i) applying an error concealment algorithm to the reference image with internal coding, and
 ii) decoding and viewing the video stream using the application of the error concealment algorithm on the reference image to visually attenuate reception errors in the video data stream:
 in case of non-reception of a reference image with internal coding in the data packet G received:
 i) checking the reception of at least one reference image of a preceding data packet G−1 and a subsequent data packet G+1,
 ii) executing an interpolation method on the uncompressed or linear data to reconstruct a damaged image, then
 iii) decoding and viewing the video stream using the reconstructed image.

2. The method of claim 1, characterized in that, in case of incomplete reception of at least one reference image of the preceding data packet G-1 and the next data packet G+1, the packet G is not displayed.

3. The method of claim 1, wherein executing an interpolation method on the reference images in the preceding and subsequent data packets to reconstruct the data image comprises at least one of:
 generating at least a part of the missing image using the interpolation method in a temporal perspective on an image in the preceding data packet and an image in the subsequent data packet; and
 generating at least a part of the missing image using the interpolation method in a spatial method on parts of the same image immediately adjacent to parts that are missing.

4. The method of claim 1, wherein if the statistical algorithm of the transmitting device organizes the returning of the missing data, checking the correct reception of the data returned by the transmitting device further comprises:
 responsive to determining a correct reception of the missing data, decoding and viewing the video stream using the missing data; and
 responsive to determining an absence of reception of all of the missing data, and that a total number of K+N blocks received including the missing data is at least equal to K, decoding, using the FEC algorithm, to retrieve the remaining missing data of the blocks K, and decoding and viewing the video stream.

5. The method of claim 1, wherein the number of blocks K comprises a minimum number of blocks required to encode a packet.

6. A device for enhancing the reliability and the quality of reception of video data streams over a wireless network governed by WiFi-type communication protocols, the device comprising:
 a network interface configured to receive, via the wireless network, a video data stream coded in a plurality of data packets G each comprising K first data blocks and N redundancy blocks for forward error correction (FEC), the video data stream comprising a succession of packets G each comprising K+N blocks being transmitted by at least one transmitting device multicasting the video data stream to the device;

a hardware processor configured to process each of the data packets G received from the transmitting device, wherein the hardware processor is configured to, for each data packet:
  responsive to determining a correct reception of the K first data blocks, decode and view the video stream using the K first data blocks;
  responsive to determining an absence of reception of all of the K first data blocks, and that a total number of K+N blocks received is at least equal to K, decode, using a forward error correction algorithm (FEC), to retrieve the missing data of the blocks K, and decode and view the video stream in case of a positive result;
  responsive to determining that if the total number of K+N blocks received is less than K or in the absence of a positive result to the decoding via the forward error correction algorithm (FEC), send, to the transmitting device, a unicast message giving information at least concerning the missing data of the blocks K; and
  if a statistical algorithm of the transmitting device organizes the returning of the missing data, check the correct reception of the missing data returned by the transmitting device, and decode and view the video stream in case of a positive result;
  in the absence of correct reception of the missing data returned by the transmitting device or in the absence of returned data, check the reception of a reference image with internal coding in the received data packet G, then if such a reference image is received complete:
    i) apply an error concealment algorithm to the reference image with internal coding, and
    ii) decode and view the video stream using the application of the error concealment algorithm on the reference image to visually attenuate reception errors in the video data stream;
  in case of non-reception of a reference image with internal coding in the data packet G received:
    i) check the reception of at least one reference image of a preceding data packet G−1 and a subsequent data packet G+1,
    ii) execute an interpolation method on the uncompressed or linear data to reconstruct a damaged image, then
    iii) decode and view the video stream using the reconstructed image.

7. The device of claim 6, wherein, in case of incomplete reception of at least one reference image of the preceding data packet G−1 and the next data packet G+1, the packet G is not displayed by the device.

8. The device of claim 6, wherein the processor configured to execute an interpolation method on the reference images in the preceding and subsequent data packets to reconstruct the data image is further configured to at least one of:
  generate at least a part of the missing image using the interpolation method in a temporal perspective on an image in the preceding data packet and an image in the subsequent data packet; and
  generate at least a part of the missing image using the interpolation method in a spatial method on parts of the same image immediately adjacent to parts that are missing.

9. The device of claim 6, wherein the processor configured to, if the statistical algorithm of the transmitting device organizes the returning of the missing data, checking the correct reception of the data returned by the transmitting device is further configured to:
  responsive to determining a correct reception of the missing data, decode and view the video stream using the missing data; and
  responsive to determining an absence of reception of all of the missing data, and that a total number of K+N blocks received including the missing data is at least equal to K, decode, using the FEC algorithm, to retrieve the remaining missing data of the blocks K, and decode and view the video stream.

10. The device of claim 6, wherein the number of blocks K comprises a minimum number of blocks required to encode a packet.

11. A non-transitory computer readable medium comprising computer executable instructions for enhancing the reliability and the quality of reception of video data streams over a wireless network governed by WiFi-type communication protocols, including instructions for:
  receiving, by a client device, a video data stream coded in a plurality of data packets G each comprising K first data blocks and N redundancy blocks for forward error correction (FEC), said video data stream comprising a succession of packets G each comprising K+N blocks being transmitted by at least one transmitting device multicasting the video data stream to the client device;
  processing each of the data packets G received from the transmitting device, wherein processing each data packet comprises:
    responsive to determining a correct reception of the K first data blocks, decoding and viewing the video stream using the K first data blocks;
    responsive to determining an absence of reception of all of the K first data blocks, and that a total number of K+N blocks received is at least equal to K, decoding, using a forward error correction algorithm (FEC), to retrieve the missing data of the blocks K, and decoding and viewing the video stream in case of a positive result;
    responsive to determining that if the total number of K+N blocks received is less than K or in the absence of a positive result to the decoding via the forward error correction algorithm (FEC), sending, by the client device, of a unicast message giving the transmitting device information at least concerning the missing data of the blocks K; and
    if a statistical algorithm of the transmitting device organizes the returning of the missing data, checking the correct reception of the missing data returned by the transmitting device, decoding and viewing the video stream in case of a positive result;
    in the absence of correct reception of the missing data returned by the transmitting device or in the absence of returned data, checking the reception of a reference image with internal coding in the received data packet G, then if such a reference image is received complete:
      i) applying an error concealment algorithm to the reference image with internal coding, and
      ii) decoding and viewing the video stream using the application of the error concealment algorithm on the reference image to visually attenuate reception errors in the video data stream:
    in case of non-reception of a reference image with internal coding in the data packet G received:

i) checking the reception of at least one reference image of a preceding data packet G−1 and a subsequent data packet G+1, ii) executing an interpolation method on the uncompressed or linear data to reconstruct a damaged image, then iii) decoding and viewing the video stream using the reconstructed image.

12. The non-transitory computer readable medium of claim 11, characterized in that, in case of incomplete reception of at least one reference image of the preceding data packet G−1 and the next data packet G+1, the packet G is not displayed.

13. The non-transitory computer readable medium of claim 11, wherein the instructions for executing an interpolation method on the reference images in the preceding and subsequent data packets to reconstruct the data image comprises at least one of:

instructions for generating at least a part of the missing image using the interpolation method in a temporal perspective on an image in the preceding data packet and an image in the subsequent data packet; and instructions for generating at least a part of the missing image using the interpolation method in a spatial method on parts of the same image immediately adjacent to parts that are missing.

14. The non-transitory computer readable medium of claim 11, wherein the instructions for, if the statistical algorithm of the transmitting device organizes the returning of the missing data, checking the correct reception of the data returned by the transmitting device further comprises instructions for:

responsive to determining a correct reception of the missing data, decoding and viewing the video stream using the missing data; and responsive to determining an absence of reception of all of the missing data, and that a total number of K+N blocks received including the missing data is at least equal to K, decoding, using the FEC algorithm, to retrieve the remaining missing data of the blocks K, and decoding and viewing the video stream.

* * * * *